United States Patent
Ochiai (12)

(10) Patent No.: US 6,287,934 B1
(45) Date of Patent: Sep. 11, 2001

(54) CAPACITOR STRUCTURE OF SEMICONDUCTOR MEMORY CELL AND METHOD FOR FABRICATING CAPACITOR STRUCTURE OF SEMICONDUCTOR CELL

(75) Inventor: Akihiro Ochiai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/353,744

(22) Filed: Jul. 14, 1999

Related U.S. Application Data

(62) Division of application No. 08/953,501, filed on Oct. 17, 1997, now Pat. No. 5,998,825.

(30) Foreign Application Priority Data

Oct. 18, 1996 (JP) .................................. 08-297409
Dec. 27, 1996 (JP) .................................. 08-350911
Jul. 31, 1997 (JP) .................................. 09-205801

(51) Int. Cl.$^7$ .............................................. H01L 21/8242
(52) U.S. Cl. ........................... 438/396; 438/253; 438/240
(58) Field of Search .................................... 438/253, 240, 438/396, FOR 220, FOR 212, FOR 430; 148/DIG. 14

(56) References Cited

U.S. PATENT DOCUMENTS

| 4,502,209 | 3/1985 | Eizenberg et al. . |
| 4,799,093 | 1/1989 | Kohara et al. . |
| 5,124,767 | 6/1992 | Koyama . |
| 5,302,844 | 4/1994 | Mizuno et al. . |
| 5,847,424 | 12/1998 | Kang . |

FOREIGN PATENT DOCUMENTS 05-048033    2/1993   (JP) .

OTHER PUBLICATIONS

S. Wolf, *Silicon Processing for the VLSI Era,* vol. 2, Lattice Presss, 1990, pp. 635–638.

*Primary Examiner*—George Fourson
*Assistant Examiner*—Michelle Estrada
(74) *Attorney, Agent, or Firm*—Sonnenschein, Nath & Rosenthal

(57) ABSTRACT

A capacitor structure in a semiconductor memory cell includes a lower electrode formed on a base body, a capacitor insulation film which is a ferroelectric thin film formed on the lower electrode, and an upper electrode formed on the capacitor insulation film. The lower electrode is shaped semi-spherical. The capacitor structure has an increased area of the upper electrode in contact with the ferroelectric thin film, local concentration of an electric field in the ferroelectric thin film is unlikely to occur.

14 Claims, 13 Drawing Sheets

CAPACITOR STRUCTURE OF SEMICONDUCTOR MEMORY CELL AND METHOD FOR FABRICATING CAPACITOR STRUCTURE OF SEMICONDUCTOR CELL

RELATED APPLICATION DATA

This application is a division of U.S. application Ser. No. 08/953,501 filed Oct. 17, 1997, now U.S. Pat. No. 5,998,825. The present and foregoing application claim priority to Japanese applications Nos. P08-350911 filed Dec. 27, 1996, P08-297409 filed Oct. 18, 1996 and P09-205801 filed Jul. 31, 1997. The foregoing application is incorporated herein by reference to the extent permitted by law.

BACKGROUND OF THE INVENTION

1. Field of the Invention

This invention relates to a capacitor structure in a semiconductor memory cell using a ferroelectric thin film and a method for fabricating such a capacitor structure. More particularly, the invention relates to a capacitor structure in a semiconductor memory cell made of a nonvolatile memory cell using a ferroelectric thin film (so-called FERAM) or DRAM, and a method for fabricating such a capacitor structure.

2. Description of the Related Art

Along with the recent progress in film-making technologies, active studies are being made for applications non-volatile memory devices using ferroelectric thin films. Nonvolatile memory utilizes high-speed polarization inversion and residual polarization in a ferroelectric thin film to enable high-speed rewriting. Nonvolatile memory devices using a ferroelectric thin film currently under studies can be classified into two systems, one for detecting changes in amount of stored charge in the ferroelectric capacitor and the other for detecting changes in resistance of the semiconductor by spontaneous polarization in the ferroelectric film. The semiconductor memory cell intended by the present invention belongs to the former system.

A nonvolatile semiconductor memory cell of the system relying on detecting changes in amount of stored charge in the ferroelectric capacitor is basically made of a ferroelectric capacitor and a select transistor. The ferroelectric capacitor is made up from, for example, a lower electrode, an upper electrode and a ferroelectric thin film sandwiched between the electrodes. Data writing and reading in the nonvolatile memory cell of this type are effected by using P-E hysteresis loop of the ferroelectric element as shown in FIG. 1. When an external field applied to the ferroelectric film is removed, spontaneous polarization occurs in the ferroelectric film. Residual polarization of the ferroelectric film exhibits $+P_r$ when a plus external field is applied, and $-P_r$ when a minus external field is applied. The state where the residual polarization is $+P_r$ (D in FIG. 1) is referred to as "0", and the state where the residual polarization is $-P_r$ (A in FIG. 1) is referred to as "1".

In order to distinguish the state of "1" or "0", a plus external field, for example, is applied to the ferroelectric thin film. Then, polarization of the ferroelectric film exhibits the state of "C" of FIG. 1. In this case, if data is "0", then the state of polarization in the ferroelectric thin film changes from D to C. On the other hand, if data is "1", the state of polarization in the ferroelectric thin film changes from A through B to C. When data is "0", polarization inversion of the ferroelectric thin film does not occur. When data is "1", polarization inversion occurs in the ferroelectric thin film. As a result, a difference is produced in amount of stored charge of the ferroelectric capacitor. By activating the select transistor of a selected memory cell, the stored charge is detected as a bit-line potential. When the external field is changed to 0 after reading data, the state of polarization in the ferroelectric thin film is changed to state D of FIG. 3 regardless of data being "0" or "1". Therefore, when data is "1", a minus external field is applied to produce state A through D and E so that data "1" be written reliably.

A sort of such nonvolatile memory (stacked nonvolatile memory) is taught by S. Onishi, et al. in the literature "A Half-Micron Ferroelectric Memory Cell Technology with Stacked Capacitor Structure", IDEM 94-843. A schematic fragmentary cross-sectional view of the nonvolatile memory cell taught in the literature is shown in FIG. 2.

In the nonvolatile memory cell having the structure shown in the literature, the top surface of the ferroelectric thin film is partly covered by an insulation film, the area of the upper electrode in contact with the ferroelectric thin film is small. That is, the effective capacitor area is small, and the amount of stored charge is small. Therefore, it is desirable to cover the entirety of the top surface of the ferroelectric thin film with the upper electrode as schematically shown in FIG. 3 in a fragmentary cross-sectional view. In this case, however, field concentration occurs at corners of the lower electrode. It causes a distortion of the P-E hysteresis loop shown in FIG. 1 or an increase in leak current, and the existence of corners of the lower electrode invites a deterioration of the capacitor structure.

OBJECTS AND SUMMARY OF THE INVENTION

It is therefore an object of the invention to provide a capacitor structure in a semiconductor memory cell ensuring a wide contact area of its upper electrode with a ferroelectric thin film while alleviating local concentration of the electric field in the ferroelectric thin film, and to provide a method for fabricating such a capacitor structure.

According to the invention there is provided a capacitor structure of a semiconductor memory cell, comprising:
  (a) a lower electrode formed on a base body;
  (b) a capacitor insulation film made of a ferroelectric thin film formed on the lower electrode; and
  (c) an upper electrode formed on the capacitor insulation film, the lower electrode having a semi-spherical shape.

The semi-spherical shape not only pertains to a shape obtained by cutting a ball along a plane but also involves other shapes obtained by butting ellipsoids or paraboloids. It further involves any other shapes whose perimetric curves obtained by cutting them along arbitrary vertical planes have differential coefficients of finite values (differential coefficients never being indefinite, or differential coefficients of continuous values). In the present invention, by making the lower electrode in a semi-spherical shape, local concentration of the electric field can be prevented, and the effective area of the capacitor can be increase. The outer contour (in a plan view) of the portion of the lower electrode in contact with the base body may be in form of a circle, oval or corner-rounded rectangle).

In the capacitor structure of the semiconductor memory according to the invention, the top surface of the base body may be in a higher level in its portion underlying the lower electrode than in its other portion near the lower electrode and not covered by the lower electrode, and the capacitor insulation film may be extended to the portion of the base body not covered by and near to the lower electrode. This structure permits a further increase of the capacitor effective area and hence a further increase of the amount of stored charge.

A method for fabricating a capacitor structure of a semiconductor memory cell according to a first aspect of the invention comprises the steps of:

(a) forming a lower electrode on a base body; and (b) forming a ferroelectric thin film on the entire surface, then forming an electrode thin film on the ferroelectric thin film, subsequently patterning the electrode thin film and the ferroelectric thin film, to form a capacitor insulation film made of the ferroelectric thin film covering the lower electrode, and an upper electrode made of the electrode thin film, wherein the lower electrode has a semi-spherical shape.

A method for fabricating a capacitor structure of a semiconductor memory cell according to a second aspect of the invention comprises the steps of:

(a) forming a lower electrode on a base body;

(b) forming a ferroelectric thin film on the entire surface, and thereafter patterning the ferroelectric thin film, to thereby obtain a capacitor insulation film in form of the ferroelectric thin film covering the lower electrode; and (c) forming an electrode thin film on the entire surface and then patterning the electrode thin film, to thereby obtain an upper electrode made of the electrode thin film, wherein the lower electrode has a semi-spherical shape.

In the method for fabricating a capacitor structure of a semiconductor memory cell according to either the first aspect or the second aspect of the invention, in the step (a) for forming the lower electrode, an upper portion of the base body in the area not covered by the lower electrode is preferably removed. In this manner, the capacitor effective area can be increased more, and the amount of stored charge can be increased more. Patterning of the electrode thin film and the ferroelectric thin film may be done so as to cover a single lower electrode, or to cover a plurality of lower electrodes. In the former mode of patterning, $V_{SS}$ (V) or $V_{CC}$ (V), for example, is applied to the upper electrode. In the latter mode of patterning, a constant voltage of $(V_{CC}-V_{SS})/2$ (V) is applied to the upper electrode.

In the capacitor structure in a semiconductor memory cell according to the invention, or in the method for fabricating a capacitor structure of a semiconductor memory cell according to the first or second aspect of the invention, the lower electrode may be formed in a version among:

(1) a version where it is made of a lower electrode layer of a semi-spherical shape (referred to as the first version);

(2) a version where it is made of a semi-spherical insulation material layer and a lower electrode layer stacked on the insulation material layer (referred to as the second version); and (3) a version where it is made of a semi-spherical conductive material layer and a lower electrode layer stacked on the conductive material layer (referred to as the third version).

In the third version, the conductive material layer may be a barrier metal layer, or an upper end portion of a contact plug extending from a source/drain region of a select transistor formed under the capacitor structure. In the first version, a plate-like barrier metal layer may be made between the lower electrode layer and the base body. In the second version, a barrier metal layer may be formed between the lower electrode and the insulation material film. Moreover, in the third version, a barrier metal layer may be formed between the lower electrode layer and the upper end of the contact plug.

A method for fabricating a capacitor structure of a semiconductor memory cell according to a third aspect of the invention comprises the steps of:

(a) forming a base layer for making a lower electrode on a base body;

(b) sequentially forming a lower electrode layer, a ferroelectric thin film and an electrode thin film on the entire surface, and subsequently patterning the electrode thin film, ferroelectric thin film and lower electrode layer, to thereby obtain a lower electrode made of the base layer and the lower electrode layer, capacitor insulation films made of the ferroelectric thin film, and an upper electrode made of the electrode thin film, wherein the base layer has a semi-spherical shape.

A method for fabricating a capacitor structure of a semiconductor memory cell according to a fourth aspect of the invention comprises the steps of:

(a) forming a base layer for making a lower electrode on a base body;

(b) forming a lower electrode layer and a ferroelectric thin film sequentially on the entire surface, and subsequently patterning the ferroelectric thin film and the lower electrode layer, to thereby obtain a lower electrode made of the base layer and the lower electrode layer, and a capacitor insulation film made of the ferroelectric film; and (c) forming an electrode thin film on the entire surface, and subsequently patterning the electrode thin film, to thereby obtain an upper electrode made of the electrode thin film, wherein the base layer has a semi-spherical shape.

In the method for fabricating a capacitor structure in a semiconductor memory cell according to the third or fourth aspect of the invention, in the step (a) of forming the base layer, an upper portion of the base body not covered by the base layer is preferably removed. It leads to a more increase in the capacitor effective area, and hence a more increase in the amount of stored charge. The base layer may be an insulation material layer or a conductive material layer. If the base layer is a conduction material layer, it may be a barrier metal layer, or may be an upper end of a contact plug extending from a source/drain region of a select transistor formed under the capacitor structure.

The ferroelectric thin film may be made by, for example, MOCVD, pulse laser ablation, sputtering or sol-gel method. Patterning of the ferroelectric thin film may be done by RIE, for example. Usable as the material of the ferroelectric thin film are $PbTiO_3$, lead titanate zirconate (PZT, $Pb(Zr_{1-y}, Ti_y)O_3$, where $0<y<1$) which is a solid solution of $PbZrC_3$ and $PbTiO_3$ having a perovskite structure, and PZT compounds, such as PLZT, a metallic oxide made by adding La to PZT, or PNZT, a metallic oxide made by adding Nb to PZT.

Also usable is a Bi layered perovskite ferroelectric thin film. Bi layered perovskite ferroelectric materials belong to a group of non-stoichiometric compounds having a latitude to compositional deviation at both sites of a metal element and an anion (O and others) element. Moreover, they may exhibit, not rarely, optimum electric characteristics in a state slight apart from a stoichiometric composition. Bi layered perovskite ferroelectric materials can be expressed by a general formula $(Bi_2O_2)^{2+}(A_{m-1}B_mO_{3m+1})^{2-}$, for example, where "A" represents a kind of metal selected from a group consisting of Bi, Pb Ba, Sr, Ca, Na, K, Cd, and so on, and "B" represents a kind of, or a combination of some in an arbitrary ratio of, Ti, Nb, Ta, W, Mo, Fe, Co and Cr. "m" is an integer not smaller than 1.

Alternatively, the Bi layered perovskite ferroelectric thin film preferably contains as its major crystal phase the crystal phase expressed by:

$$Bi_X(Sr, Ca, Ba)_Y(Ta_Z, Nb_{1-Z})_2O_d \qquad (1)$$

where $1.7 \leq X \leq 2.5$, $0.6 \leq Y \leq 1.2$, $0 \leq Z \leq 1.0$ and $0.8 \leq d \leq 10.0$. "(Sr, Ca, Ba)" means one kind of element selected from a group consisting of Sr, Ca and Ba. Alternatively, the ferroelectric thin film preferably contains as its main crystal phase the crystal phase expressed by:

$$Bi_X Sr_Y Ta_2 O_d \qquad (2)$$

where $1.7 \leq X \leq 2.5$, $0.6 \leq Y \leq 1.2$, and $0.8 \leq d \leq 10.0$. In these cases, the ferroelectric thin film more preferably contains 85% or more of the crystal phase expressed by Equation (1) or (2) as its main crystal phase. The ferroelectric thin film containing the crystal phase expressed by Equation (1) or (2) as its main crystal phase may contain a small amount of Bi oxide, Ta or Nb oxides, or compound oxides of Bi, Ta and Nb. Composition of the ferroelectric thin film expressed by Equation (1) can be expressed in stoichiometric compositions as, for example, $Bi_2SrTa_2O_9$, $Bi_2SrNb_2O_9$, $Bi_2BaTa_2O_9$, $Bi_2SrTaNbO_9$. Otherwise usable as the ferroelectric film are $Bi_4SrTiO_{15}$, $Bi_4Ti_3O_{12}$, $Bi_2PbTa_2O_9$, and so on. Here again, composition ratios of respective metal elements can be varied within a range not changing the crystallographic structure.

The lower electrode (lower electrode layer) and/or the upper electrode (electrode thin film) in the capacitor structure of the semiconductor memory cell according to the invention may be made of, for example, $RuC_2$, $IrO_2$, layered $RuO_2/Ru$, Pt, Pd, layered Pt/Ti, layered of Pt/Ta, layered Pt/TiTa, $La_{0.5}Sr_{0.5}CoO_3$ (LSCO), layered Pt/LSCO, or $YBa_2Cu_3O_7$. In multi-layered films shown above, materials appearing left of "/" form a layer adjacent the ferroelectric thin film whereas materials appearing right of "/" form a layer adjacent the base body or a plate line. The upper electrode may commonly form the plate line, or a separate plate line other than the upper electrode may be formed. Usable for making the upper electrode layer and the electrode thin film are sputtering or pulse laser ablation. Usable for patterning the lower electrode layer and the electrode thin film is, for example, ion milling or RIE.

Usable as materials of the insulation material layer are known materials such as $SiO_2$, BPSG, PSG, BSG, AsSG, PbSG, SbSG, NSG, SOG, LTO (Low Temperature Oxide, low temperature $CVD-SiO_2$), etc., or their multi-layered films. Usable as materials of the conductive material layer are tungsten, Pt, Pd, Cu, TiW, TiNW, $WSi_2$, and $MoSi_2$, for example. Usable for making the barrier metal layer are Ti, TiN, Ti/TiN, and TaN. The barrier metal layer may be made by sputtering, for example. The barrier metal layer is made for purposes of improving the close contact of the lower electrode with the base body, improving the crystallographic property of the lower electrode, and preventing the material of the lower electrode layer from diffusing into the base layer.

The semiconductor memory cell having the capacitor structure according to the invention may be a nonvolatile memory cell (so-called FERAM) or DRAM.

DETAILED DESCRIPTION OF THE PREFERRED EMBODIMENTS

The invention is described below by way of some embodiments with reference to the drawings.

(First Embodiment)

Figure 1:
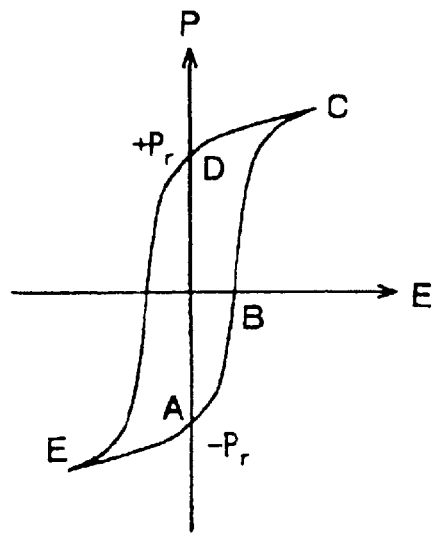
FIG. 1 is a diagram showing a P-E hysteresis loop of a ferroelectric element.
Figure 2:
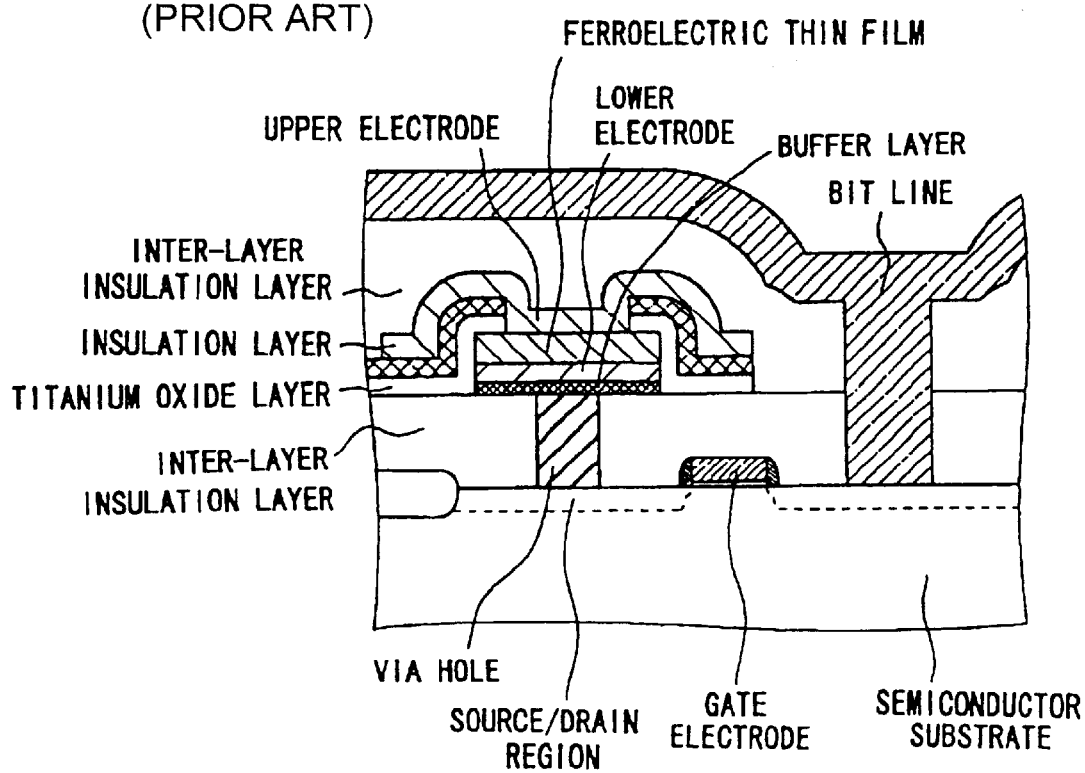
FIG. 2 is a schematic fragmentary cross-sectional view of a conventional nonvolatile memory cell.
Figure 3:
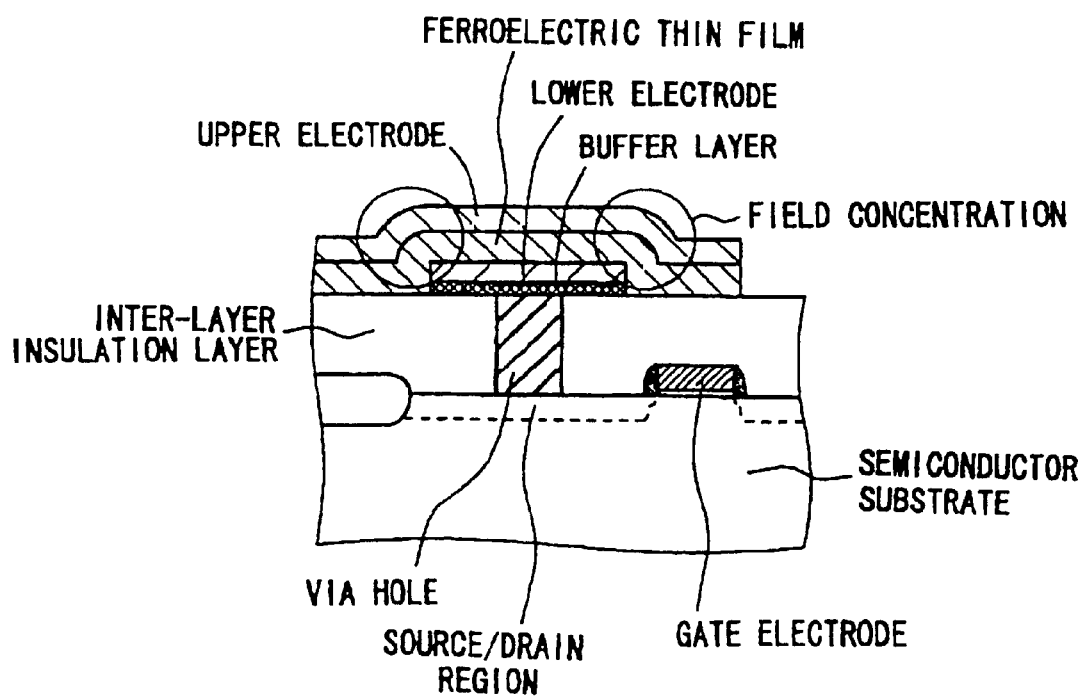
FIG. 3 is a schematic fragmentary cross-sectional view of a conventional nonvolatile memory cell.
Figure 4:
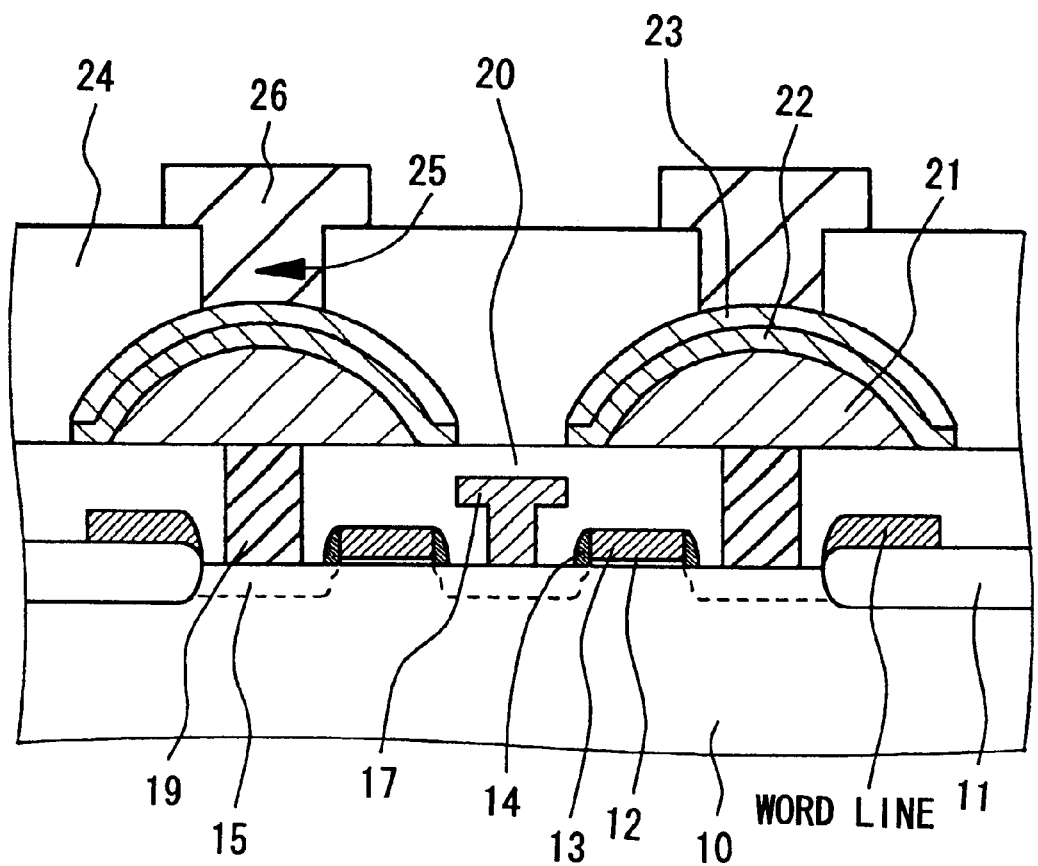
FIG. 4 is a schematic fragmentary cross-sectional view of a capacitor structure in a semiconductor memory cell according to the first embodiment of the invention.
Figure 5A:
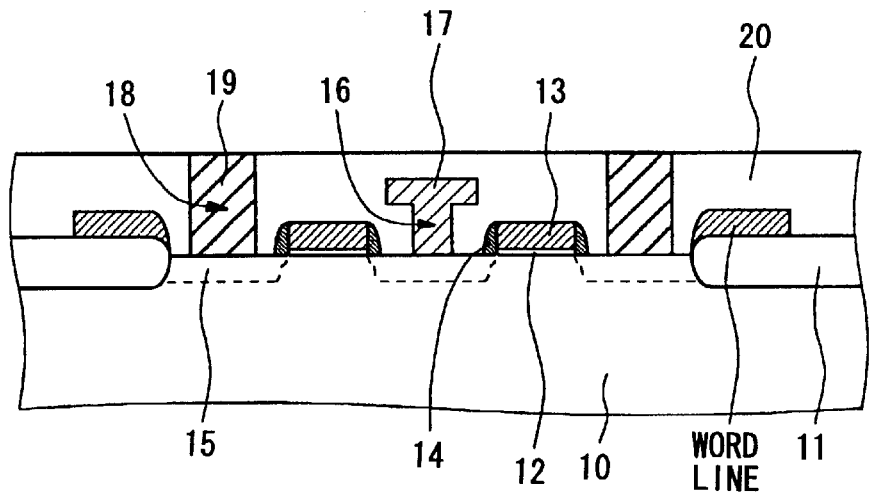
FIGS. 5A and 5B are schematic fragmentary cross-sectional views of a semiconductor substrate and other elements for explaining a method for fabricating a capacitor structure of a semiconductor memory cell according to the first embodiment of the invention.
Figure 5B:
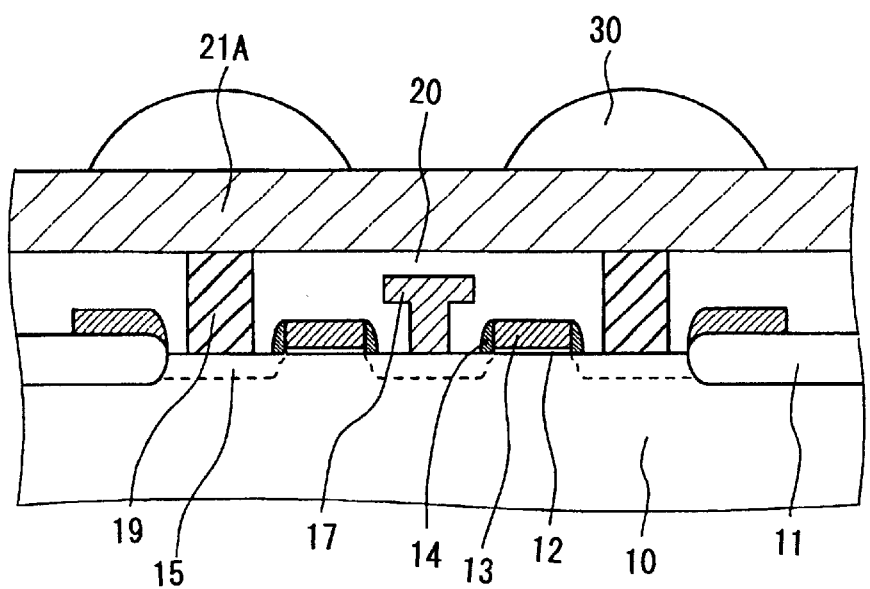
Figure 6A:
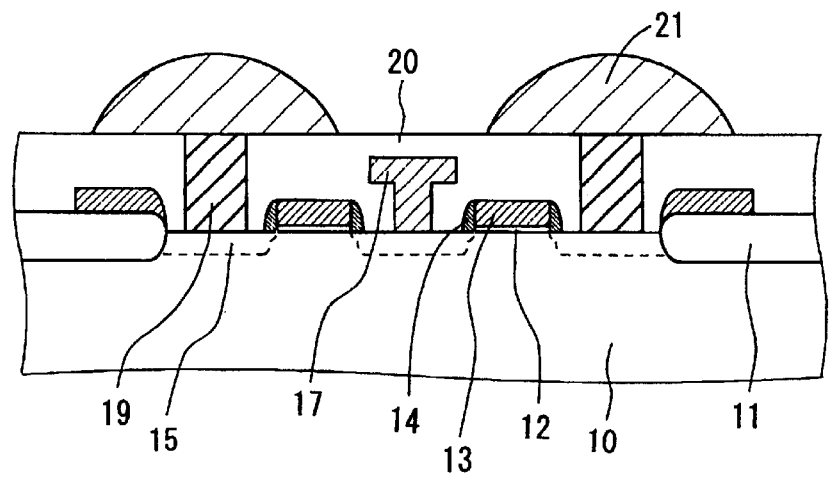
FIGS. 6A and 6B are schematic fragmentary cross-sectional views of the semiconductor substrate and other elements for explaining the method for fabricating the capacitor structure of the semiconductor memory cell, subsequent to FIGS. 5A and 5B.
Figure 6B:
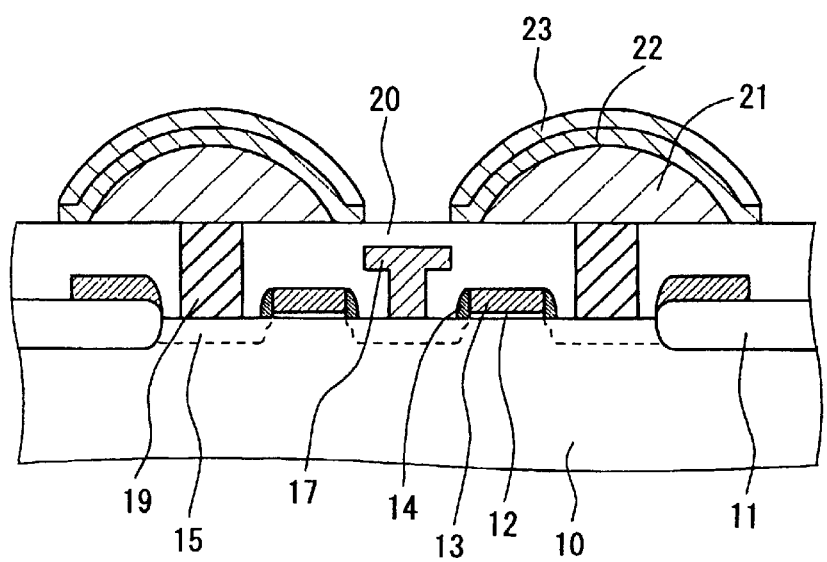

FIG. 4 is a fragmentary cross-sectional view schematically showing a capacitor structure of a semiconductor memory cell taken as the first embodiment. The capacitor structure includes a lower electrode 21 formed on a base body which is an inter-layer insulation layer 20 made of BPSG, for example, a capacitor insulation film 22 in form of a ferroelectric thin film formed on the lower electrode 21, and an upper electrode 23 formed on the capacitor insulation film 22. The lower electrode 21 has a semi-spherical shape. In the first embodiment, each lower electrode is made of a lower electrode layer having a semi-spherical shape (first version). The capacitor insulation film 22 and the upper electrode 23 cover a single lower electrode 21. In the capacitor structure having the above-mentioned structure, each upper electrode 23 is connected to a plate line 26, and $V_{SS}$ (V) or $V_{CC}$ (V), for example, is applied to the upper electrode 23 via the plate line 26. Numeral 24 denotes an insulation layer.

Formed under the inter-layer insulation layer 20 is a select transistor. The select transistor is located between device separating regions 11 formed on a semiconductor substrate 10, and includes a gate oxide film 12 formed on the surface of the semiconductor substrate 10, a gate electrode 13, and source/drain regions 15. One of the source/drain regions 15 is connected to the lower electrode 21 through a connection hole (contact hole) 19, and the other source/drain region 15 is connected to a bit line 17. The bit line is applied with, for example, $V_{CC}$ (V) or $V_{SS}$ (V). Although the drawing does not illustrate, the bit line 17 actually extends in right and left directions on the plane of FIG. 4 without contacting the connection hole 19. Since the gate electrode 13 commonly behaves as a word line, by applying $V_{SS}$ (V) to the plane line 26 and $V_{cc}$ (V) to the bit line 17, or by applying $V_{CC}$ (V) to the plate line 26 and $V_{SS}$ (V) to the bit line 17, information of "0" or "1" can be written in the capacitor insulation film made of the ferroelectric thin film.

Explanation is made below on a method for fabricating the capacitor structure of the semiconductor memory cell according to the first embodiment, with reference to fragmentary cross-sectional views of FIGS. 5A, 5B, 6A and 6B schematically showing the semiconductor substrate and other elements.

(Step 100)

First made is the select transistor on the semiconductor substrate 10. For this purpose, the device separating regions 11 having a LOCOS structure, for example, are formed by a known process. The device separating regions may have a trench structure. After that, the surface of the semiconductor substrate 10 is oxidized by a pyrogenic method to form gate oxide films 12. Next, a polycrystalline silicon layer doped with an impurity is made on the entire surface by CVD, and then patterned to form gate electrodes 13. The gate electrodes 13 behaves also as word lines. Then, ion implantation is done to the semiconductor substrate 10 to form an LDD structure. After that, a $SiO_2$ film is made on the entire surface by CVD and etched back to form gate side walls 14 on side surfaces of the gate electrodes 13. Then, after ion implantation is made into the semiconductor substrate 10, annealing is done to activate the injected impurities. Thus, the source/drain regions 15 are formed. Next made is a first inter-layer insulation film of $SiO_2$ by CVD, and an aperture 16 is made in the first inter-layer insulation film overlying one of the source/drain regions 15 by RIE. A polycrystalline silicon layer doped with an impurity is made on the first inter-layer insulation layer and inside the aperture 16 by CVD. Then, by patterning the polycrystalline silicon layer on the first inter-layer insulation layer, the bit line 17 is formed. After that, a second inter-layer insulation layer made of BPSG is formed on the entire surface by CVD whose exemplary details are shown below. Note here that, after the second inter-layer insulation layer made of BPSG is formed, the second inter-layer insulation layer is preferably processed for reflow in a nitrogen gas atmosphere at 900° C. for 20 minutes, for example. Moreover, if necessary, the second inter-layer insulation layer is smoothed by chemically and mechanically polishing the top surface of the second inter-layer insulation layer by chemical-mechanical polishing (CMP), for example. The first inter-layer insulation layer and the second inter-layer insulation layer are hereinafter referred to in combination as a single inter-layer insulation layer 20. After that, an opening 18 is made in the inter-layer insulation layer 20 underlying the other source/drain region 15 by RIE, and polycrystalline silicon doped with an impurity is embedded into the aperture 18 to complete the connection hole (contact plug) 19. As a result, the structure schematically shown in FIG. 5A in a fragmentary cross-sectional view can be obtained. In the figure, the first inter-layer insulation layer and the second inter-layer insulation layer are shown in combination as the inter-layer insulation layer 20. Although the drawing does not illustrate, the bit line 17 actually extends in right and left directions on the plane of the drawing without contacting the connection hole 19.

Gas used: $SiH_4/PH_3/B_2H_6$

Film making temperature: 400° C.

Reaction pressure: atmospheric pressure (Step 110)

Next made are the lower electrodes on the inter-layer insulation layer 20 behaving as the base body. For this purpose, first made is a lower electrode layer 21A of $RuO_2$ on the inter-layer insulation layer 20 by DC sputtering using Ru (ruthenium) as the target and $O_2/Ar$ as the process gas. After that, a positive resist material 30 is applied onto the entire surface, and the resist material 30 is patterned through exposure and development. After that, post-baking processing is applied to the resist material 30 at a temperature of 150 to 170° C. to shape the resist material 30 semi-spherical. As a result, the structure schematically shown in FIG. 5B in a fragmentary cross-sectional view can be obtained. Prior to the lower electrode layer 21A being formed, a barrier metal layer of Ti/TiN, for example, may be formed on the inter-layer insulation layer 20 as the base body by sputtering. In this case, the Ti layer is the lower layer and the TiN layer is the upper layer.

(Step 120)

After that, the lower electrode layer 21A is dry-etched by RIE using $O_2/Cl_2$ mixed gas. In this case, etching conditions are determined to substantially equalize the etching speed of the resist material 30 with the etching speed of the lower electrode layer 21A. As a result, the pattern of the resist material 30 is substantially copied onto the lower electrode layer 21A, and the lower electrodes 21 each having a semi-spherical shape are formed. In other words, an appropriate etching speed is selected so that the pattern of the resist material 30 be substantially copied onto the lower electrode layer 21A to form the lower electrodes 20 having a semi-spherical shape. In this manner, the structure schematically shown in FIG. 5A in a fragmentary cross-sectional view is obtained in which each semi-spherical lower electrode layer 21A forms each lower electrode 21. A portion of each lower electrode 21 in contact with the inter-layer insulation layer 20 as the base body has a substantially elliptic outer shape (in a plan view). If the minimum etching-processed dimension (line width) is F, and the dimension of a single semiconductor memory cell 4.8F× 2.4F ($=12F^2$), then the substantially elliptic outer contour may be as long as 3.8F along the longer axis and 1.4F along the shorter axis.

(Step 130)

After that, a ferroelectric thin film made of a Bi layered perovskite ferroelectric material is formed on the entire surface by MOCVD. For example, conditions for making the ferroelectric thin film expressed by $Bi_xSr_yTa_2O_d$ in Equation (2) are shown below.

Source material:
Sr(C$_{11}$H$_{19}$O$_2$)$_2$
Bi(C$_6$H$_5$)$_3$
Ta(OC$_2$H$_5$)$_5$
Film making temperature: 650 to 750° C.
Film making pressure: 27 to 400 Pa
Oxygen concentration: 50%

Alternatively, a ferroelectric thin film expressed by Bi$_X$Sr$_Y$Ta$_2$O$_d$ of Equation (2) may be formed on the entire surface by laser ablation. An example of film making conditions used here is shown below. Note here that, after the ferroelectric film expressed by Bi$_X$Sr$_Y$Ta$_2$O$_d$ of Equation (2) is formed, post-baking is done at 800° C. for one hour in an oxygen atmosphere.

Target: Bi$_X$Sr$_Y$Ta$_2$O$_d$
Laser used: KrF excimer laser (wavelength: 248 nm, pulse width: 25 nanoseconds, 5 Hz)
Film making temperature: 500° C.
Oxygen concentration: 3 Pa (Step 140)

Next made on the ferroelectric thin film, in the same manner as Step 110, is an electrode thin film made of RuO$_2$, and the electrode thin film and the ferroelectric thin film are patterned by RIE. As a result, the capacitor insulation film 22 in form of the ferroelectric thin film covering each lower electrode 21, and the upper electrode 23 in form of the electrode thin film made of RuO$_2$, can be obtained. Thus, the structure schematically shown in FIG. 6B in a fragmentary cross-sectional view is obtained.

(Step 150)

After that, the insulation layer is stacked on the entire surface, and an aperture 25 is made in the insulation layer 24 overlying the upper electrode 23 by RIE. Then, a metal wiring material layer of an aluminum alloy, for example, is formed on the insulation layer 24 and inside the aperture 25 by sputtering, and the metal wiring material layer is patterned to form plate lines 26. As a result, the structure schematically shown in FIG. 4 in a fragmentary cross-sectional view can be obtained.

Figure 7:
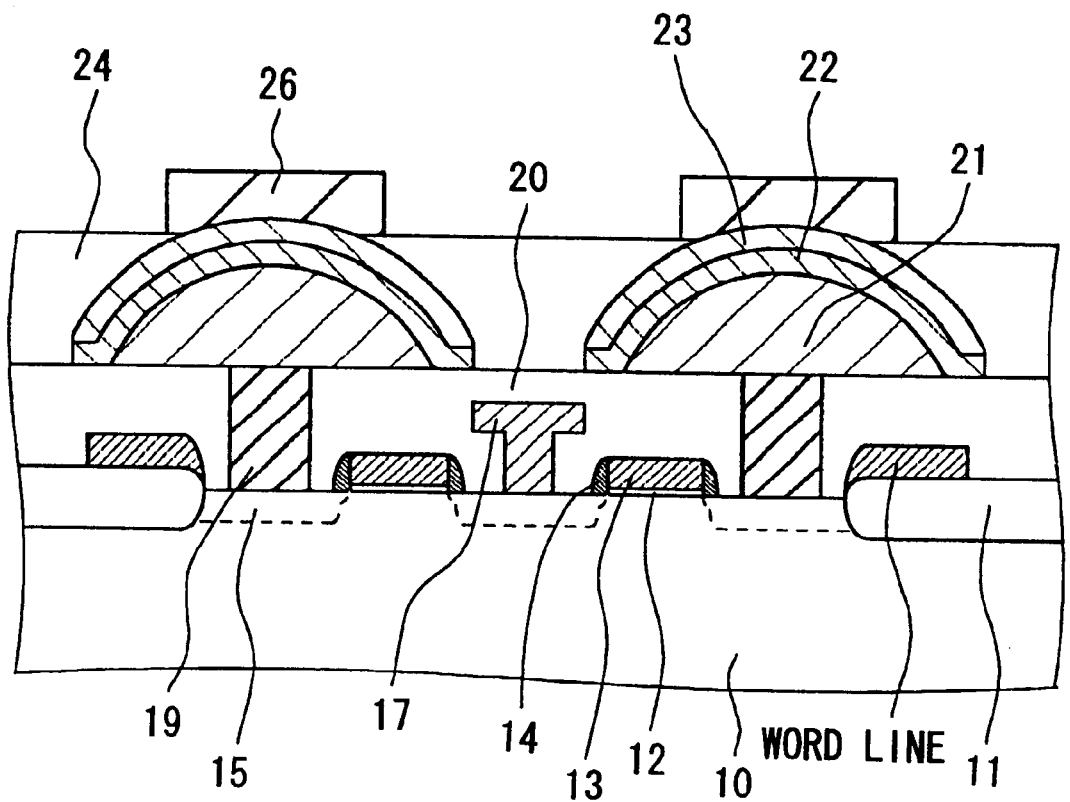
FIG. 7 is a schematic fragmentary cross-sectional view of a capacitor structure of a semiconductor memory cell as a modified version of the first embodiment.

Alternatively, the plate line 26 may be made by, after stacking the insulation film 24 on the entire surface, etching back the insulation layer 24 to expose the top portion of the upper electrode 23, then forming a metal wiring material layer of an aluminum alloy, for example, by sputtering, and thereafter patterning the metal wiring layer. A resulting structure is schematically shown in FIG. 7 in a fragmentary cross-sectional view. In the structure shown in FIG. 7, each upper electrode 23 is directly connected to the plate line 26, not through the contact hole.

(Second Embodiment)

Figure 9:
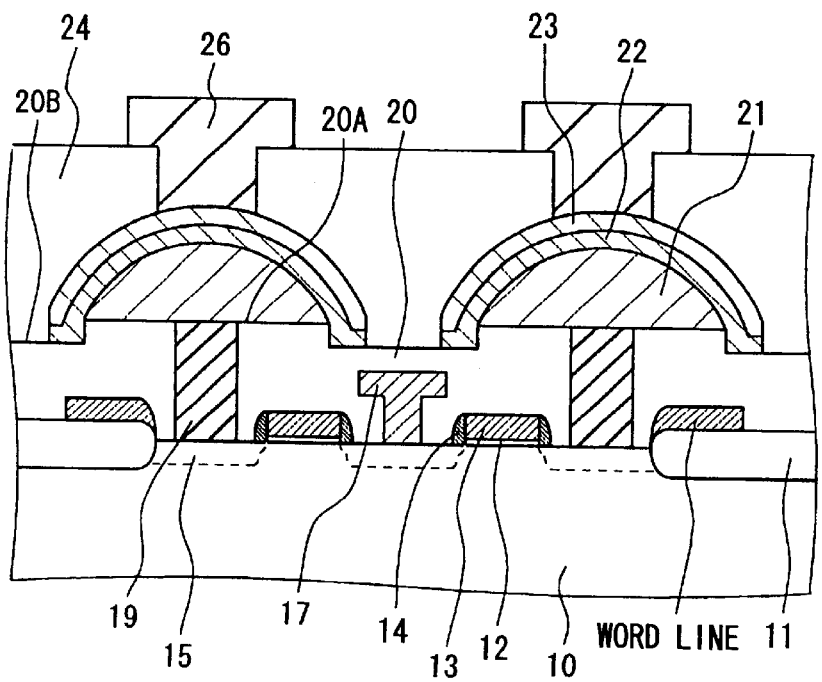
FIG. 9 is a schematic fragmentary cross-sectional view of the capacitor structure of the semiconductor memory cell according to the second embodiment of the invention.

The second embodiment is a modified version of the first embodiment. In the capacitor structure of a semiconductor memory cell according to the second embodiment, as schematically shown in FIG. 9 in a fragmentary cross-sectional view, the top surface in each location 20A of the base body (inter-layer insulation layer 20) underlying the lower electrode 21 is in a higher level than the top surface of locations 20B of the base body (inter-layer insulation layer 20) around and offset from the lower electrode 21. The capacitor insulation film 22 extends to a portion of each location 20B of the base body (inter-layer insulation layer 20) around and offset from the lower electrode 21.

Figure 8:
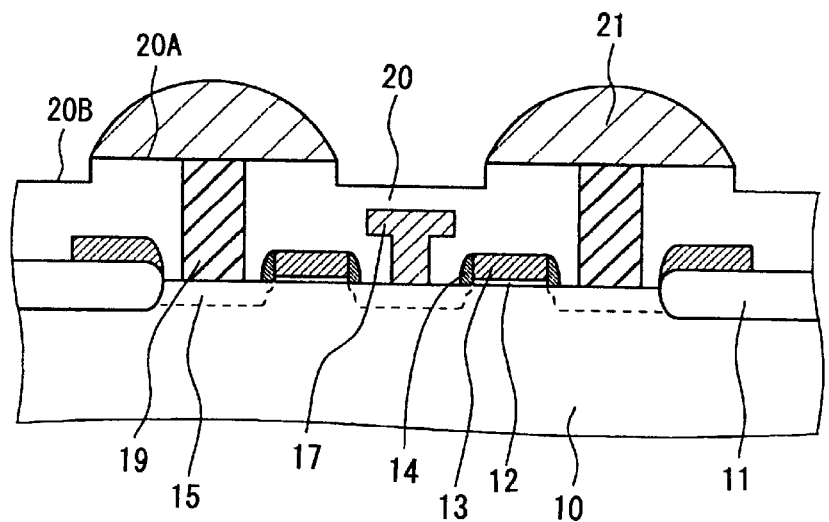
FIG. 8 is a schematic fragmentary cross-sectional view of a semi-processed configuration of a capacitor structure of a semiconductor memory cell according to the first embodiment of the invention.

The capacitor structure of a semiconductor memory cell according to the second embodiment can be obtained by removing (etching) an upper portion of the base body (inter-layer insulation layer 20) not covered by the lower electrode 21 upon dry-etching the lower electrode layer 21A of RuO$_2$ in Step 120 of the first embodiment (see FIG. 8). In this manner, the area of the portion of the capacitor insulation film, namely, the ferroelectric thin film, sandwiched by the lower electrode 21 and the upper electrode 23 can be increased, and the amount of stored charge can be increased. The structure of the plate lines shown in FIG. 7 may be used in the capacitor structure of the semiconductor memory cell according to the second embodiment.

(Third Embodiment)

The third embodiment is a method for fabricating the capacitor structure of a semiconductor memory cell according to the second embodiment of the invention. A difference of the third embodiment from the first embodiment lies in forming the ferroelectric thin film on the entire surface after making the lower electrode 21, then patterning the ferroelectric thin film, further forming the capacitor insulation film made of the ferroelectric thin film covering each lower electrode, then forming the electrode thin film on the entire surface, next patterning the electrode thin film, and thus obtaining the lower electrodes made of the electrode thin film. The capacitor structure obtained here is the same as the capacitor structure obtained by the first embodiment except that the side surfaces of the capacitor insulation film 22 are covered by the upper electrode 23. Each lower electrode 21 is made of the lower electrode layer 21 having a semi-spherical shape.

More specifically, in the same manner as Step 130 of the first embodiment, the ferroelectric thin film made of a Bi layered perovskite ferroelectric material expressed by Bi$_X$Sr$_Y$Ta$_2$O$_d$ in Equation (2), for example, is formed on the entire surface by MOCVD or pulse laser ablation. Then, the ferroelectric thin film is patterned by RIE. After that, in the same manner as Step 110, the electrode thin film of RuO$_2$ is formed on the entire surface and patterned by RIE. In the other respects, steps of the method for fabricating the capacitor structure of the semiconductor memory cell may be the same as those of the first embodiment, and detailed explanation thereof is omitted here.

Also in the third embodiment, like the second embodiment, the top surface of each location 20A of the base body (inter-layer insulation layer 20) underlying the lower electrode 21 may be in a higher level than the top surface of the location 20B of the base body (inter-layer insulation layer 20) around and offset from the lower electrode 21, and the capacitor insulation film 22 may extend to a portion of each location 20B of the base body (inter-layer insulation layer 20) around and offset from the lower electrode 21. Here again, an upper portion of base body (inter-layer insulation layer 20) not covered by the lower electrode may be removed (etched) upon dry-etching the lower electrode layer 21A of RuO$_2$ in Step 120 of the first embodiment.

(Fourth Embodiment)

Figure 10:
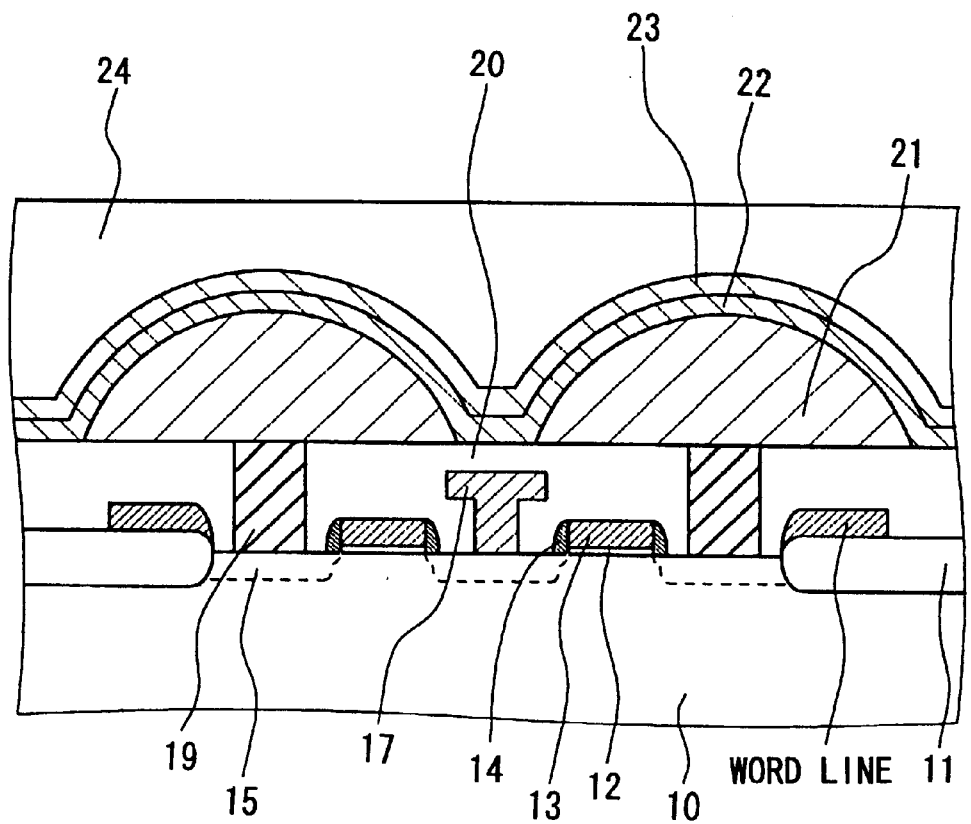
FIG. 10 is a schematic fragmentary cross-sectional view of a capacitor structure of a semiconductor memory cell according to the fourth embodiment of the invention.

A schematic fragmentary cross-sectional view of a capacitor structure of a semiconductor memory cell according to the fourth embodiment is shown in FIG. 10. The capacitor structure shown here is essentially the same as the capacitor structure of a semiconductor memory cell explained with the first embodiment. The fourth embodiment is different from the first embodiment in that each capacitor insulation film 22 and each upper electrode 23 cover a plurality of lower electrodes 21. That is, a single plate electrode connects one of memory blocks each including a plurality of semiconductor memory cells. In the capacitor structure shown here, the upper electrode 23 itself behaves as the plate electrode, and a constant voltage of $(V_{CC} - V_{SS})/2$ (V), for example, is applied to the upper electrode 23. Thus, by applying $V_{CC}$ (V) or $V_{SS}$ (V) to the bit line 17, information of "0" or "1" can be written in the capacitor insulation film 22 made of the ferroelectric thin film. In the semiconductor memory cells of this type, since a plurality of semiconductor memory cells (a memory block) share a single plate electrode, each semiconductor memory cell can be small-scaled, and contributes to a high integration of semiconductor memory cells.

The capacitor structure of semiconductor memory cells according to the fourth embodiment can be obtained by patterning the electrode thin film and the ferroelectric thin film to cover a plurality of lower electrodes 21 (eight lower electrodes, for example) in Step 140 of the first embodiment. In this case, unlike the first embodiment, the electrode thin film and the ferroelectric thin film need not be patterned to individually cover each single lower electrode. Therefore, the area of the capacitor insulation film 22 can be increased. That is, in the first embodiment, a distance not smaller than the minimum distance acceptable for etching-must be provided between respective adjacent upper electrodes 23. In the fourth embodiment, however, since the electrode thin film and the ferroelectric thin film are patterned to cover a plurality of lower electrodes 21, the minimum distance acceptable for etching may be made between respective adjacent lower electrodes 21. Therefore, in the fourth embodiment, each lower electrode 21 may be made larger than that of the first embodiment. As a result, a larger area of the capacitor insulation film and a larger amount of stored charge can be obtained.

Figure 11:
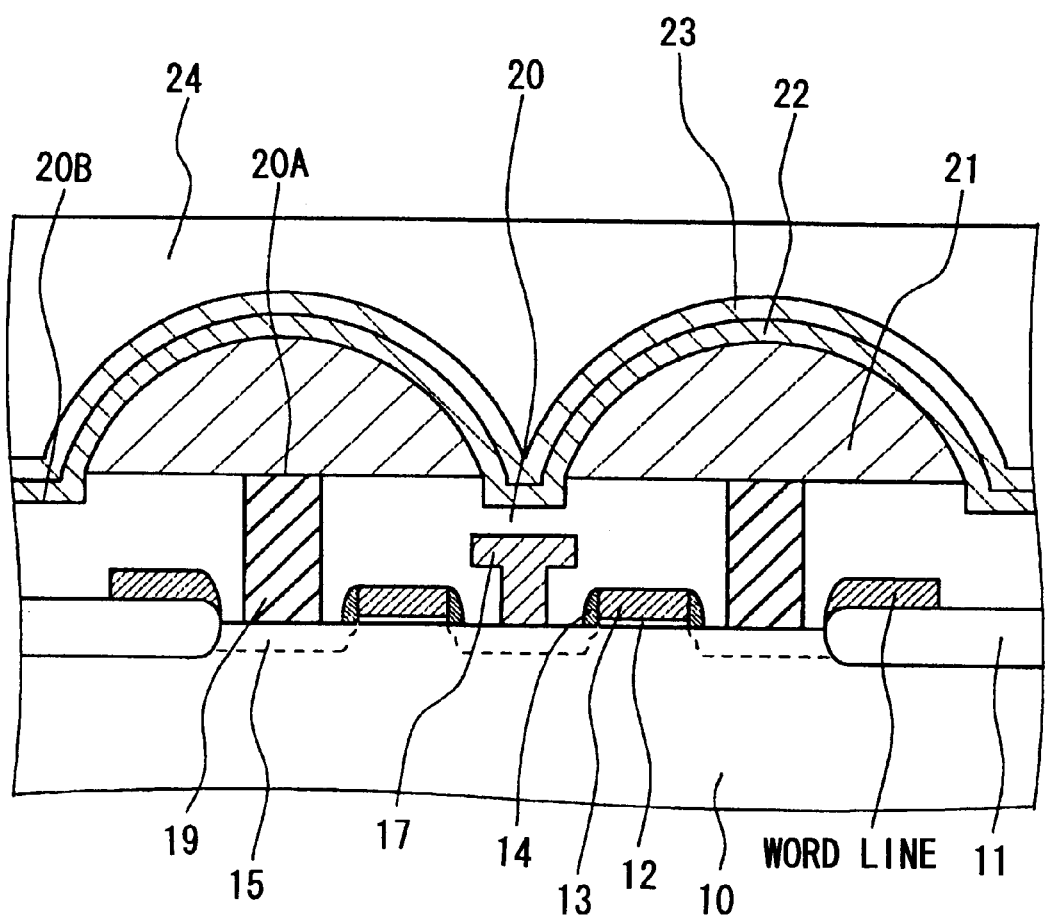
FIG. 11 is a schematic fragmentary cross-sectional view of the capacitor structure of the semiconductor memory cell according to the fourth embodiment of the invention.

As schematically shown in FIG. 11 in a fragmentary cross-sectional view, the top surface of locations 20A of the base body (inter-layer insulation layer 20) underlying the lower electrode 21 may be in a higher level than the top surface of locations 20B of the base body (inter-layer insulation layer 20) around and offset from the lower electrode 21, and the capacitor insulation film 22 may extend to a portion of each location 20B of the base body (inter-layer insulation layer 20) around and offset from the lower electrode 21, as employed in the second embodiment. Here again, an upper portion of the base body (inter-layer insulation layer 20) not covered by the lower electrodes may be selectively removed (etched) upon dry-etching the lower electrode layer 21A of $RuO_2$ in Step 120 of the first embodiment. As a result, the area of the capacitor insulation film 22, namely, the ferroelectric thin film sandwiched between the lower electrode 21 and the upper electrode 23, can be increased more, and the amount of stored charge can be increased more.

Alternatively, the capacitor structure of the semiconductor memory cell according to the fourth embodiment can be made by the method explained with the third embodiment (the method for fabricating the capacitor structure of the semiconductor memory cell according to the second embodiment), that is, by forming the ferroelectric thin film on the entire surface after making the lower electrodes 21, then patterning the ferroelectric thin film to form the capacitor insulation film 22, further forming the electrode thin film on the entire surface, and then patterning the electrode thin film to make upper electrodes 23.

In the capacitor structures of semiconductor memory cells explained with the first to fourth embodiments, the lower electrode 21 is made of the semi-spherical lower electrode layer 21A by dry-etching the lower electrode layer 21A. However, if the surface of the lower electrode layer 21A behaving as the base layer of the ferroelectric thin film is roughened by etching, deterioration in P-E hysteresis loop characteristics of the ferroelectric thin film may occur. In this case, the lower electrode layer not damaged by etching is preferably used as the base layer for making the ferroelectric thin film. In fifth to eighth embodiments explained below, although the lower electrode has a semi-spherical shape, the ferzoelectric thin film can be formed on the lower electrode layer in its original surface condition, and hence, deterioration in P-E hysteresis loop characteristics of the ferroelectric thin film can be prevented.

(Fifth Embodiment)

Also the fifth embodiment is a modified version of the first embodiment. In the first embodiment, the lower electrode 21 is made of the semi-spherical lower electrode layer 21A (first version). In the fifth embodiment, however, each lower electrode 21 of the semiconductor memory cell includes a semi-spherical insulation material layer 40 and the lower electrode layer 21A stacked on the insulation material layer 40 (second version). In the other respects, the capacitor structure shown here may be the same as the capacitor structure of the semiconductor memory cell according to the first embodiment, and detailed explanation thereof is omitted here.

For fabricating the capacitor structure of the semiconductor memory cell according to the fifth embodiment, the following steps may be executed in lieu of Step 100, Step 110 and Step 120 of the first embodiment. That is, by executing a step similar to Step 100 of the first embodiment, the second inter-layer insulation layer is formed. In the next step of the fifth embodiment, instead of making the aperture portion, a positive resist material is applied onto the entire surface, and patterned through exposure and development. After that, post-baking processing at 150 to 170° C. is done to the resist material to shape the resist material semi-spherical. Then, the inter-layer insulation layer 20 is dry-etched by RIE. In this case, appropriate etching conditions are chosen to substantially equalize the etching speed of the resist material to the etching speed of the inter-layer insulation layer 20. As a result, the pattern of the resist material is approximately copied to the inter-layer insulation layer 20, and the insulation material layer 40, which is a semi-spherical part of the inter-layer insulation layer 20, can be formed. In other words, an appropriate etching speed is selected to substantially copy the pattern of the resist material onto the inter-layer insulation layer 20 and to obtain the semi-spherical insulation material layer 40.

Alternatively, a different film of an insulation material having a certain etch selectivity relative to the inter-layer insulation layer 20 as the base body is formed on the inter-layer insulation layer 20. For example, if the inter-layer insulation layer 20 is made of BPSG, then the insulation material layer 40 may be mad of SiN, for example. After that, a positive resist material is applied onto the insulation material layer, then patterned by exposure and development, and subsequently processed by post-baking at 150 to 170° C., to shape the resist material semi-spherical. Next executed is RIE to dry-etch the insulation material layer. In this case, etching conditions are selected appropriately to substantially equalize the etching speed of the resist material and the etching speed of the insulation material layer. As a result, the pattern of the resist material is substantially copied onto the insulation material layer, and the semi-spherical insulation material layer 40 can be obtained. In other words, an appropriate etching speed is selected to substantially copy the pattern of the resist material onto the insulation material layer 40 and to obtain the semi-spherical insulation material layer 40.

After that, an aperture is made through the inter-layer insulation layer 30 and the insulation material layer 40 overlying one of the source/drain regions 15, and polycrystalline silicon doped with an impurity is applied into the aperture to complete the connection hole (contact plug) 19.

Subsequently, DC sputtering is performed using Ru (ruthenium) as the and $O_2/Ar$ as the process gas to form the lower electrode layer 21A made of $RuO_2$ on the entire surface involving the insulation material layer 40. The lower electrode layer 21A is then dry-etched by RIE using $O_2/Cl_2$. In this manner, the semi-spherical insulation material layer 40 made of SiN, and the lower electrode made of the lower electrode layer 21A stacked on the insulation material layer 40, can be obtained. Note here that dry-etching of the lower electrode layer 21A is conducted for patterning the lower electrode layer 21A, and not for shaping the lower electrode layer 21 semi-spherical. The surface of the lower electrode layer 21A on which the ferroelectric thin film should be made is covered by the resist material during etching of the lower electrode layer 21A. Therefore, the ferroelectric thin film can be formed on the lower electrode layer 21A maintaining its original surface condition, and deterioration in P-E hysteresis loop characteristics of the ferroelectric thin film can be prevented.

The structure of the lower electrode explained with the fifth embodiment is applicable to the lower electrode of the capacitor structure of the semiconductor memory explained with either the second or fourth embodiment. Moreover, the method for fabricating the capacitor structure of the semiconductor memory cell explained with the third embodiment can be used for fabricating the lower electrode structure explained with the fifth embodiment. Additionally, a barrier metal layer may be formed between the lower electrode layer 21A and the insulation material layer 40.

(Sixth Embodiment)

Figure 13:
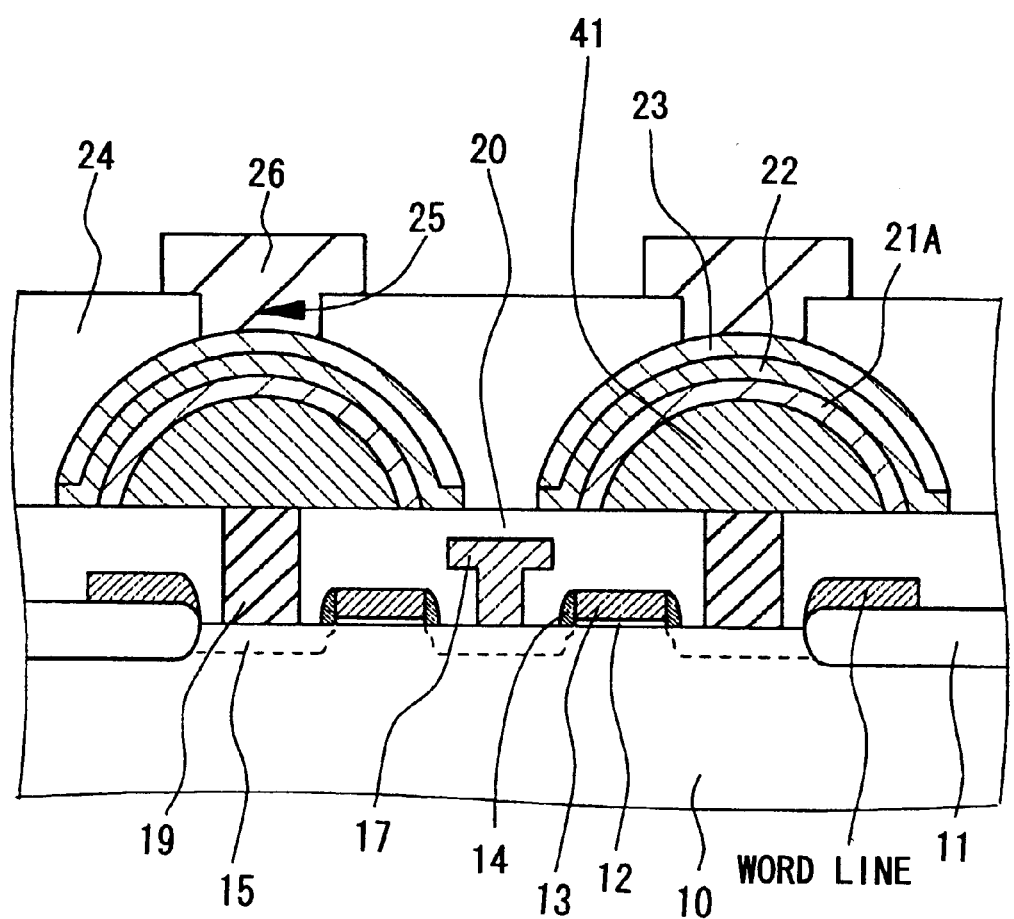
FIG. 13 is a schematic fragmentary cross-sectional view of a capacitor structure of a semiconductor memory cell according to the sixth embodiment of the invention.

Also the sixth embodiment is a modified version of the first embodiment. In the sixth embodiment, as schematically shown in FIG. 13 in a fragmentary cross-sectional view, the lower electrode is made of a semi-spherical conductive material layer of Ti/TiN (the Ti layer is the lower and the TiN is the upper), and the lower electrode layer 21A stacked on the conductive material layer (third version). The conductive material layer used in the sixth embodiment is a barrier metal layer 41. In the other respects, the structure taken here may be the same as the capacitor structure of the semiconductor memory cell according to the first embodiment, and detailed explanation thereof is omitted here. FIG. 13 shows the barrier metal layer 41 as a single layer.

For fabricating the capacitor structure of the semiconductor memory cell according to the sixth embodiment, the following steps may be executed instead of Step 110 and Step 120 of the first embodiment. That is, prior to the lower electrode layer 21A being formed, the Ti/TiN barrier metal layer 41 is first made on the inter-layer insulation layer 20 as the base body by sputtering under conditions as shown below as an example.

Sputtering conditions of Ti layer process gas: Ar=35 sccm pressure: 0.52 Pa

Rf power: 2 kW heating of the substrate: none

Sputtering conditions of TiN layer process gas: $N_2/Ar$=100/35 sccm pressure: 1.0 Pa RF power: 6 kW heating of the substrate: none After that, a positive resist material is applied onto the entire surface, and then patterned by exposure and development. Then, the resist material is processed by post-baking at 150 to 170° C. to shape the resist material semi-spherical. Next executed is RIE using $Ar/Cl_2$ mixed gas to dry-etch the barrier metal layer 41. In this case, etching conditions are selected appropriately to substantially equalize the etching speed of the resist material and the etching speed of the barrier metal layer 41. As a result, the pattern of the resist material is substantially copied onto the barrier metal layer 41, and the semi-spherical barrier metal layer 41 is obtained. In other words, an appropriate etching speed is selected to substantially copy the pattern of the resist material onto the barrier metal layer 41, and to obtain the semi-spherical barrier metal layer 41.

Subsequently, the lower electrode layer 21A made of $RuO_2$ is formed on the entire surface involving the barrier metal layer 41 by DC sputtering using Ru (ruthenium) as the target and $O_2/Ar$ as the process gas. Then, the lower electrode layer 21A is dry-etched by RIE using $O_2/Cl_2$ mixed gas. In this manner, the semi-spherical barrier metal layer 41 made of Ti/TiN, and the lower electrode in form of the lower electrode layer 21A stacked on the barrier metal layer 41, can be obtained. Dry-etching of the lower electrode 21A is for the purpose of patterning the lower electrode layer 21A, and not for shaping the lower electrode 21A semi-spherical. The surface of the lower electrode layer 21A on which the ferroelectric thin film should be made is covered by the resist material during etching of the lower electrode layer 21A. Thierefore, the ferroelectric thin film can be formed on the lower electrode layer 21A maintaining its original surface condition, and deterioration in P-E hysteresis loop characteristics of the ferroelectric thin film can be prevented.

The structure of the lower electrode explained with the sixth embodiment is applicable to the lower electrode of the capacitor structure of the semiconductor memory explained with either the second or fourth embodiment. Moreover, the method for fabricating the capacitor structure of the semiconductor memory cell explained with the third embodiment can be used for fabricating the lower electrode structure explained with the sixth embodiment.

(Seventh Embodiment)

Figure 14:
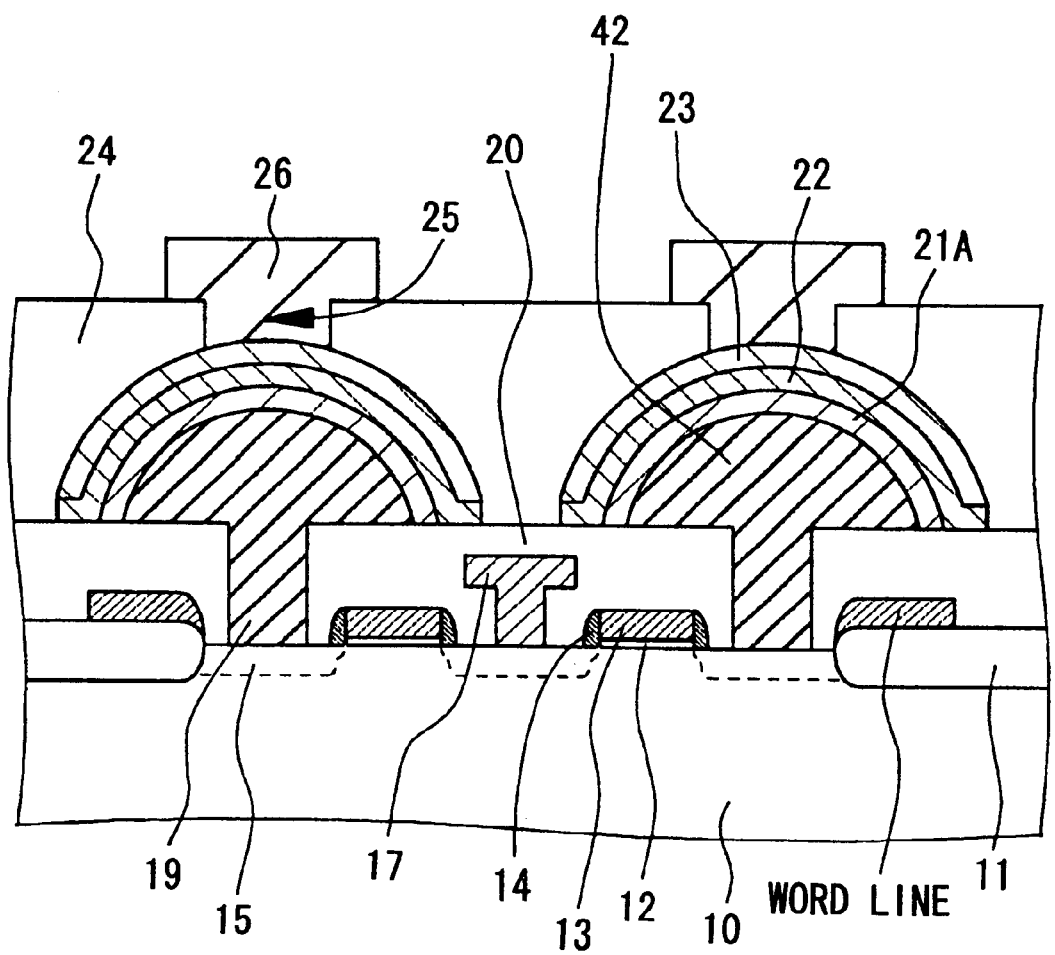
FIG. 14 is a schematic fragmentary cross-sectional view of a capacitor structure of a semiconductor memory cell according to the seventh embodiment of the invention.
Figure 15:
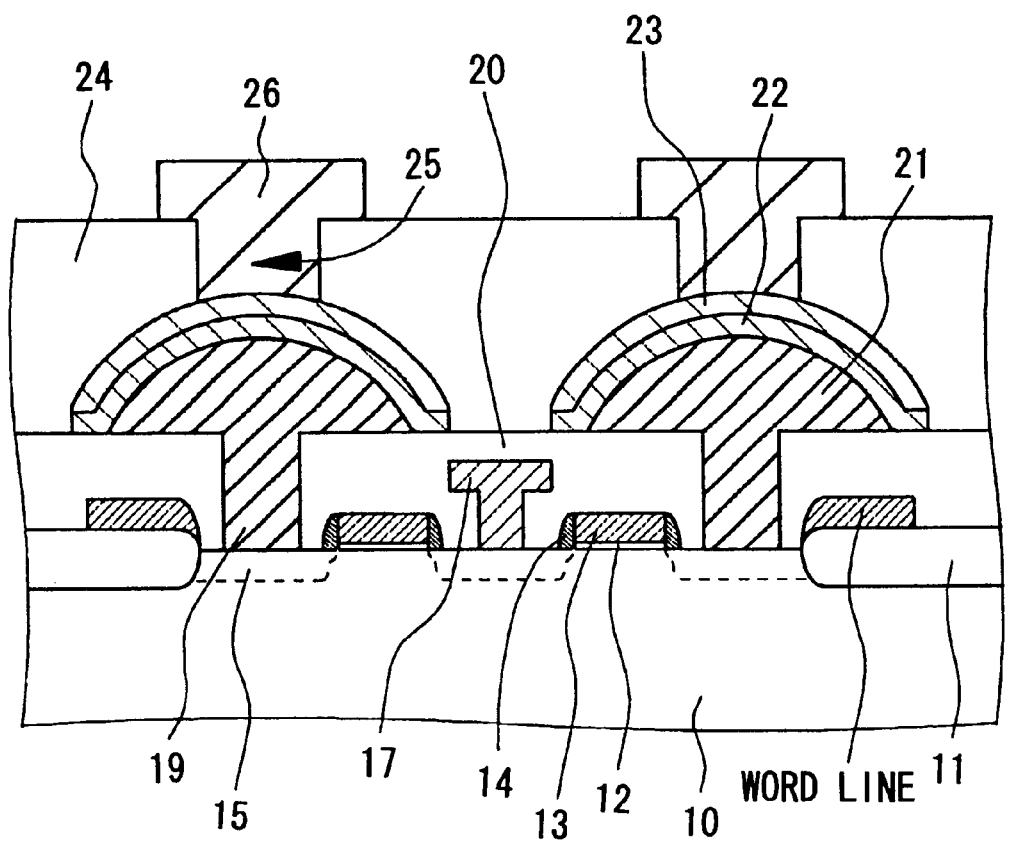
FIG. 15 is a schematic fragmentary cross-sectional view of a capacitor structure of a semiconductor memory cell as a modified version of the first embodiment.

Also the seventh embodiment is a modified version of the first embodiment. In the seventh embodiment, as schematically shown in FIG. 14 in a fragmentary cross-sectional view, the lower electrode 21 is made of a semi-spherical conductive material layer 42 of Ti/TiN (the Ti layer is the lower and the TiN is the upper), and the lower electrode layer 21A stacked on the conductive material layer (third version). The conductive material layer 42 is the upper end of the contact plug (contact hole 19) extending from the source/drain region 15 of the select transistor formed under the capacitor structure. In the other respects, the structure taken here may be the same as the capacitor structure of the semiconductor memory cell according to the first embodiment, and detailed explanation thereof is omitted here.

For fabricating the capacitor structure of the semiconductor memory cell according to the seventh embodiment, the following steps may be executed instead of Step 100, Step 210 and Step 120 of the first embodiment. That is, after the aperture is made in the inter-layer insulation layer 20 in Step 100, a tungsten layer is formed on the inter-layer insulation layer 20 and inside the aperture by so-called blanket tungsten CVD to bury tungsten in the aperture. Thus, the contact hole (connection hole 19) is made. The tungsten layer overlying the inter-layer insulation layer 20 forms the conductive material layer 42. An example of CVD conditions of the tungsten layer is shown below. Prior to burying tungsten into the aperture, a Ti layer and a TiN layer are sequentially formed on the inter-layer insulation layer 20 and inside the aperture by magnetron sputtering, for example. The purpose of forming the Ti layer and the TiN layer is to obtain an ohmic low contact resistance, prevent damages to the semiconductor substrate 10 during blanket tungsten CVD and improve the close contact of tungsten. The drawing omits illustration of the Ti layer and the TiN layer.

Sputtering conditions of Ti layer (20 nm thick)
- process gas: Ar=35 sccm
- pressure: 0.52 Pa
- RF power: 2 kW
- heating of the substrate: none Sputtering conditions of TiN layer (100 nm thick)
- process gas: $N_2$/Ar=100/35 sccm
- pressure: 1.0 Pa
- RF power: 6 kW
- heating of the substrate: none Sputtering conditions of tungsten
- gas used: $WF_6$/$H_2$/Ar=40/400/2250 sccm
- pressure: 10.7 kPa
- film making temperature: 450° C.

Subsequently, a positive resist material is applied onto the entire surface, and then patterned by exposure and development. After that, the resist material is processed by post-baking at 150 to 170° C. to shape the resist material semi-spherical. Next executed is RIE shown below as an example to dry-etch the conductive material layer 42 made of the tungsten layer. In this case, etching conditions are selected appropriately to substantially equalize the etching speed of the resist material and the etching speed of the conductive material layer 42. As a result, the pattern of the resist material is substantially copied onto the conductive material layer 42, and the semi-spherical conductive material layer 42 is obtained. In other words, an appropriate etching speed is selected to substantially copy the pattern of the resist material onto the conductive material layer 42, and to obtain the semi-spherical conductive material layer 42.

Sputtering conditions of tungsten layer, TiN layer and Ti layer first step etching: etching of tungsten layer
- gas used: $SF_6$/Ar/He=110:90:5 sccm
- pressure: 46 Pa
- RF power: 275 W second step etching: TiN layer/Ti layer
- gas used: Ar/$Cl_2$=75/5 sccm
- pressure: 6.5 Pa
- RF power: 250 W Subsequently, the lower electrode layer 21A made of $RuO_2$ is formed on the entire surface involving the conductive material layer 42 by DC sputtering using Ru (ruthenium) as the target and $O_2$/Ar as the process gas. Then, the lower electrode layer 21A is dry-etched by RIE using $O_2$/$Cl_2$ mixed gas. In this manner, the conductive material layer 42, and the lower electrode made of the lower electrode layer 21A stacked on the conductive material layer 42, can be obtained. Dry-etching of the lower electrode 21A is done for the purpose of patterning the lower electrode layer 21A, and not for shaping the lower electrode 21A semi-spherical. The surface of the lower electrode layer 21A on which the ferroelectric thin film should be made is covered by the resist material during etching of the lower electrode layer 21A. Therefore, the ferroelectric thin film can be formed on the lower electrode layer 21A maintaining its original surface condition, and deterioration in P-E hysteresis loop characteristics of the ferroelectric thin film can be prevented.

The structure of the lower electrode explained with the seventh embodiment is applicable to the lower electrode of the capacitor structure of the semiconductor memory explained with either the second or fourth embodiment. Moreover, the method for fabricating the capacitor structure of the semiconductor memory cell explained with the third embodiment can be used for fabricating the lower electrode structure explained with the seventh embodiment. A barrier metal layer may be formed between the lower electrode layer 21A and the conductive material layer 42.

(Eighth Embodiment)

The eighth embodiment is directed to a method for fabricating the capacitor structure of the semiconductor memory cell according to the third or fourth embodiment of the invention. That is, first made on the base body is a semi-spherical base layer forming the lower electrode. Next formed on the entire surface are the lower electrode layer, ferroelectric thin film, and electrode thin film in sequence, and they are patterned to form the lower electrode made of the base layer and the lower electrode layer, the capacitor insulation film made of the ferroelectric thin film, and the upper electrode made of the electrode thin film.

Alternatively, a semi-spherical base layer forming the lower electrode is made onto the base body. After that, the lower electrode layer and the ferroelectric thin film are formed in sequence on the entire surface, and they are patterned to form the lower electrode made of the base layer and the lower electrode layer, and the capacitor insulation film made of the ferroelectric thin film. Then, the electrode thin film is formed on the entire surface, and then patterned to obtain the upper electrode made of the electrode thin film.

More specifically, in the same manner as the fifth to seventh embodiments, the base layer comprising the semi-spherical insulation material layer 40 and the barrier metal layer 41 or the conductive material layer 42 is formed. The next step of the fifth to seventh embodiments is to form and pattern the lower electrode, form the ferroelectric thin film and the electrode thin film and pattern the electrode thin film and the ferroelectric thin film. The fifth to seventh embodiments may form and pattern the lower electrode layer, form and pattern the ferroelectric thin film, and form and pattern the electrode thin film.

Figure 12:
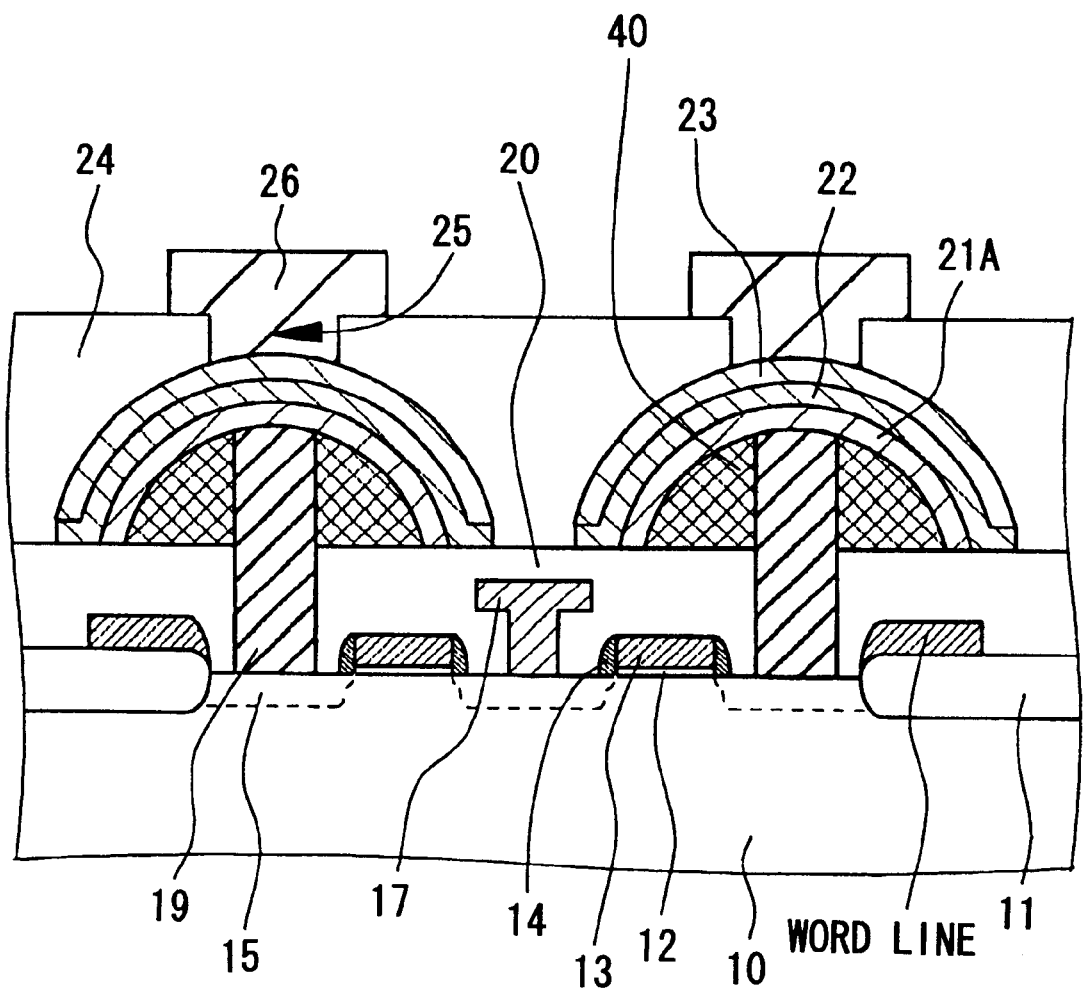
FIG. 12 is a schematic fragmentary cross-sectional view of a capacitor structure of a semiconductor memory cell according to the fifth embodiment of the invention.

In the eighth embodiment, however, in the same manner as Step 110, Step 130 and Step 140 of the first embodiment, the lower electrode layer 21A, ferroelectric thin film and electrode thin film are sequentially formed on the inter-layer insulation layer 20 involving the base layer. After that, the electrode thin film, ferroelectric thin film and lower electrode layer are patterned. As a result, the lower electrode comprising the base layer and the lower electrode layer, the capacitor insulation film comprising the ferroelectric thin film, and the upper electrode comprising the electrode thin film having the same structure as shown in FIGS. 12 through 14 can be obtained.

Alternatively, after the base layer is formed, in the same manner as Step 110 and Step 130 of the first embodiment, the lower electrode layer 21A and the ferroelectric film are formed sequentially on the inter-layer insulation layer 20 and the base layer, and they are patterned thereafter. After that, in the same manner as Step 140 of the first embodiment, the electrode thin film is formed on the entire surface, and then patterned. As a result, the lower electrode comprising the base layer and the lower electrode layer, the capacitor insulation film comprising the ferroelectric thin film, and the upper electrode comprising the electrode thin film having the same structure as shown in FIGS. 12 through 14 can be obtained.

The capacitor structure of the semiconductor memory cell explained with the eighth embodiment can be applied to fabrication of the lower electrode in the capacitor structure of the semiconductor memory cell explained with the second or fourth embodiment.

Although the invention has been explained by way of specific embodiments thereof, the invention is not limited to these examples. The gate electrode 13 and the bit line 17 may be made of polycide or metal silicide instead of the polysilicon layer. Usable as the inter-layer insulation layer 20 are, instead of EPSG and $SiO_2$, known insulation materials such as PSG, BSG, AsSG, PbSG, SbSG, SOG, SiON and SIN, or multi-layered films of these insulation materials. The step of forming the bit line 17 may be changed appropriately. For example, the bit line may be formed after the plate line 26 is formed (see the structure of the bit line in FIG. 17).

The ferroelectric thin film may be made of PZT or PZLT, instead of a Bi layered perovskite ferroelectric material. An example of conditions for making a PZT film or a PLZT film by magnetron sputtering is shown below.

Target: PZT or PZLT

Process gas: $Ar/O_2$=90/10 in volume %

Pressure: 4 Pa

Power: 50 W

Film making temperature: 500° C.

Alternatively, PZT or PLZT may be made by pulse laser ablation. An example of film making conditions therefor is shown below.

Target: PZT or PLZT

Laser used: KrF excimer layer (wavelength:

248 nm, pulse width: 25 nm, 3 Hz)

Output energy: 400 mJ (1.1 $J/cm^2$)

Film making temperature: 550 to 600° C.

Oxygen concentration: 40 to 120 Pa

The upper electrode 23 may be made of platinum. An example of conditions for making a Pt film by RF magnetron sputtering is shown below.

Anode voltage: 2.6 kV

Input power: 1.1 to 1.6 $W/cm^2$

Process gas: $Ar/O^2$=90/10 sccm

Pressure: 0.7 Pa

Film making temperature: 600 to 750° C.

Stacking speed: 5 to 10 nm/minute

Alternatively, the upper electrode may be made of LSCO, for example. An example of conditions for making a LSCO film by pulse laser ablation is shown below.

Target: LSCO

Laser used: KrF excimer laser (wavelength:

248 nm, pulse width: 25 ns, 3 Hz)

Output energy: 400 mJ (1.1 $J/cm^2$)

Film making temperature: 550 to 600° C.

Oxygen concentration: 40 to 120 Pa

The connection hole (contact plug) 19 may be made by embedding into the aperture formed in the inter-layer insulation layer a metal wiring material made of a metal having a high melting point, such as Ti, Pt, Pd, Cu, TiW, TiNW, $WSi_2$, $MoSi_2$, or a metal silicide. The top surface of the connection hole may in the same level as the surface of the inter-layer insulation layer 20, or the top portion of the connection hole may be extended onto the surface of the inter-layer insulation layer 20. If appropriate, as shown in FIG. 12, the top portion extended onto the surface of the base body 20 may be used as the semi-spherical lower electrode in the first embodiment.

The capacitor structure of a semiconductor memory cell according to the invention and the method for fabricating the capacitor structure according to the invention can be applied to DRAM, in addition to nonvolatile memory cells using a ferroelectric thin film (so-called FERAM). In this case, polarization of the ferroelectric thin film is used within a range of applied voltage not causing polarization inversion. That is, here is used the characteristic of the ferroelectric thin film where the difference ($P_{max}$–Pr) between the maximum (saturated) polarization $P_{max}$ upon an external electric field being applied and the residual polarization $P_r$ upon the external field being 0 is constant (substantially proportional) relative to the source voltage. The state of polarization of the ferroelectric thin film is maintained between the saturated polarization ($P_{max}$) and the residual polarization ($P_r$), and it is not inverted. Data is held by refresh.

The invention not only prevent local concentration of the electric field but also increase the capacitor effective area by shaping the lower electrode semi-spherical. As a result, the invention overcomes various problems, namely, distortion in the P-E hysteresis loop, increase of leak current, fatigue deterioration of the ferroelectric thin film, and so on, and prevents deterioration of characteristics of the capacitor structure. Moreover, a wider area of the upper electrode in contact with the ferroelectric thin film permits an increase in amount of stored charge in the capacitor insulation film.

Additionally, by forming the lower electrode as a multi-layered structure while using its semi-spherical shape, the ferroelectric thin film can be formed on the lower electrode layer maintaining its original surface condition. Therefore, the ferroelectric thin film, obtained exhibits excellent characteristics without deterioration in P-E hysteresis loop characteristics.

What is claimed is:

1. A method for fabricating a capacitor structure of a semiconductor memory cell comprising the steps of:

(a) forming a lower electrode on a base body;

(b) forming a ferroelectric film on the entire surface, then forming an electrode film on said ferroelectric film, subsequently patterning said electrode film and said ferroelectric film, to form a capacitor insulation film made of said ferroelectric film covering said lower electrode, and an upper electrode made of said electrode film, wherein said lower electrode has a semi-spherical shape; and (c) removing an upper portion of said base body not covered by said lower electrode during formation of said lower electrode.

2. A method for fabricating a capacitor structure of a semiconductor memory cell comprising the steps of:

(a) forming a lower electrode on a base body;

(b) forming a ferroelectric film on the entire surface, and thereafter patterning said ferroelectric film, to thereby obtain a capacitor insulation film made of said ferroelectric film covering said lower electrode;

(c) forming an electrode film on the entire surface and then patterning said electrode film, to thereby obtain an upper electrode made of said electrode film, wherein said lower electrode has a semi-spherical shape; and (d) removing an upper portion of said base body not covered by said lower electrode during formation of said lower electrode.

3. The method for manufacturing a capacitor structure of a semiconductor memory cell according to claim 1 wherein said lower electrode is made of a semi-spherical lower electrode layer.

4. The method for manufacturing a capacitor structure of a semiconductor memory cell according to claim 1 wherein said lower electrode is made of a semi-spherical insulation material layer and a lower electrode layer stacked on said insulation material layer.

5. The method for manufacturing a capacitor structure of a semiconductor memory cell according to claim 1 wherein said lower electrode is made of a semi-spherical conductive material layer and a lower electrode layer stacked on said conductive material layer.

6. The method for manufacturing a capacitor structure of a semiconductor memory cell according to claim 5 wherein said conductive material layer is a barrier metal layer.

7. The method for manufacturing a capacitor structure of a semiconductor memory cell according to claim 5 wherein said conductive material layer is an upper end of a contact plug extending from a source/drain region of a select transistor formed under said capacitor structure.

8. A method for fabricating a capacitor structure of a semiconductor memory cell comprising the steps of:
   (a) forming a base layer for making a lower electrode on a base body;
   (b) sequentially forming a lower electrode layer, a ferroelectric film and an electrode film on the entire surface, and subsequently patterning said electrode film, said ferroelectric film and said lower electrode layer, to thereby obtain a lower electrode made of said base layer and said lower electrode layer, a capacitor insulation film made of said ferroelectric film, and an upper electrode made of said electrode film, wherein said base layer has a semi-spherical shape.

9. A method for fabricating a capacitor structure of a semiconductor memory cell comprising the steps of:
   (a) forming a base layer for making a lower electrode on a base body;
   (b) forming a lower electrode layer and a ferroelectric film sequentially on the entire surface, and subsequently patterning said ferroelectric film and said lower electrode layer, to thereby obtain a lower electrode made of said base layer and said lower electrode layer, and a capacitor insulation film made of said ferroelectric film; and
   (c) forming an electrode film on the entire surface, and subsequently patterning said electrode film, to thereby obtain an upper electrode made of said electrode film, wherein said base layer has a semi-spherical shape.

10. The method for fabricating a capacitor structure of a semiconductor memory cell according to claim 8 wherein said step (a) includes a step of removing an upper portion of said base body not covered by said base layer during formation of said base layer.

11. The method for manufacturing a capacitor structure of a semiconductor memory cell according to claim 8 wherein said base layer is made of an insulation material layer.

12. The method for manufacturing a capacitor structure of a semiconductor memory cell according to claim 8 wherein said base layer is made of a conductive material layer.

13. The method for manufacturing a capacitor structure of a semiconductor memory cell according to claim 12 wherein said conductive material layer is a barrier metal layer.

14. The method for manufacturing a capacitor structure of a semiconductor memory cell according to claim 12 wherein said conductive material layer is an upper end of a contact plug extending from a source/drain region of a select transistor formed under said capacitor structure.

* * * * *